United States Patent
Sahmuganathan et al.

(10) Patent No.: US 12,327,733 B2
(45) Date of Patent: Jun. 10, 2025

(54) METHODS TO REDUCE UNCD FILM ROUGHNESS

(71) Applicants: Applied Materials, Inc., Santa Clara, CA (US); National University of Singapore, Singapore (SG)

(72) Inventors: Vicknesh Sahmuganathan, Singapore (SG); Eswaranand Venkatasubramanian, Santa Clara, CA (US); Jiteng Gu, Singapore (SG); Kian Ping Loh, Singapore (SG); Abhijit Basu Mallick, Sunnyvale, CA (US); John Sudijono, Singapore (SG)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 671 days.

(21) Appl. No.: 17/671,938

(22) Filed: Feb. 15, 2022

(65) Prior Publication Data
US 2023/0260800 A1    Aug. 17, 2023

(51) Int. Cl.
*H01L 21/311*    (2006.01)
*H01L 21/02*    (2006.01)

(52) U.S. Cl.
CPC .. *H01L 21/31144* (2013.01); *H01L 21/02115* (2013.01); *H01L 21/02274* (2013.01); *H01L 21/02205* (2013.01)

(58) Field of Classification Search
CPC ......... H01L 21/02115; H01L 21/02205; H01L 21/02274; H01L 21/31144
See application file for complete search history.

(56) References Cited

U.S. PATENT DOCUMENTS

| | | | |
|---|---|---|---|
| 2007/0220959 A1* | 9/2007 | Sumant | G01Q 70/14 73/105 |
| 2010/0084634 A1 | 4/2010 | Gamo et al. | |
| 2012/0015507 A1* | 1/2012 | Tanaka | H01J 37/3244 438/513 |

(Continued)

FOREIGN PATENT DOCUMENTS

| JP | 2000026193 A * | 1/2000 |
|---|---|---|
| KR | 20070072849 A | 7/2007 |

OTHER PUBLICATIONS

Arantes et al "Fourier Transform Infrared Spectroscopic Study of Boron-Doped Micro/Nano/Ultrananocrystalline Diamond Prepared by Chemical Vapor Deposition" Materials Science Forum vol. 802, pp. 140-145 © 2014 (Year: 2014).*

(Continued)

*Primary Examiner* — Nathan H Empie
(74) *Attorney, Agent, or Firm* — SERVILLA WHITNEY LLC

(57) ABSTRACT

Hard masks and methods of forming hard masks are described. The hard mask has an average roughness less than 10 nm and a modulus greater than or equal to 400 GPa. The method comprises exposing a substrate to a deposition gas comprising a dopant gas or a precursor (solid (e.g. Alkyl-borane compounds) or liquid (e.g. Borazine)), a carbon gas and argon at a temperature less than or equal to 550 C, and igniting a plasma from the deposition gas to form an ultrananocrystalline diamond film having an average roughness less than 10 nm and a modulus greater than or equal to 400 GPa.

17 Claims, 1 Drawing Sheet

(56) References Cited

U.S. PATENT DOCUMENTS

| | | | |
|---|---|---|---|
| 2014/0130215 A1* | 5/2014 | Brinkley | G01Q 70/16 427/133 |
| 2016/0053366 A1 | 2/2016 | Stowell et al. | |
| 2017/0062216 A1 | 3/2017 | Chen et al. | |
| 2018/0138036 A1 | 5/2018 | Baldasseroni et al. | |

OTHER PUBLICATIONS

Moneger et al "Deposition of nanocrystalline diamond in pulsed Ar/H2/CH4 microwave discharges" Diamond & Related Materials 16 2007, 1295-1299. (Year: 2007).*

Williams et al ("High Young's modulus in ultra thin nanocrystalline diamond" Chemical Physics Letters 495 (2010) 84-89 (Year: 2010).*

Lamara et al "Diamond thin film growth by pulsed microwave plasma at high power density in a CH4-H2 gas mixture" Surface and Coatings Technology 174-175 (2003) 784-789 (Year: 2003).*

PCT International Search Report and Written Opinion in PCT/US2023/062534 dated Jul. 13, 2023, 9 pages.

"96 Layers and Beyond: Solving 3D NAND Material and Integration Challenges", Entegris Pure Advantage, 10 pgs.

Taylor, Andrew, et al., "Effect of plasma composition on nanocrystalline diamond layers deposited by a microwave linear antenna plasma-enhanced chemical vapour deposition system", Phys. Status Solidi A 212, No. 11, 2418-2423 (2015).

Taylor, Andrew, et al., "Large area deposition of boron doped nano-crystalline diamond films at low temperatures using microwave plasma enhanced chemical vapour deposition with linear antenna delivery", Diamond & Related Materials 47 (2014) 27-34.

Zeng, Hongjun, et al., "Boron-doped ultrananocrystalline diamond synthesized with an H-rich/Ar-lean gas system", Carbon 84 (2014) 103-117.

* cited by examiner

METHODS TO REDUCE UNCD FILM ROUGHNESS

TECHNICAL FIELD

Embodiments of the disclosure generally relate to methods for patterning a substrate. In particular, embodiments of disclosure relate to methods for forming smooth hard mask layers for patterning purposes.

BACKGROUND

Ultrananocrystalline diamond (UNCD) film has garnered significant research interest over the last two decades and remains an attractive member of the diamond family. It covers a wide range of applications ranging from biomedical devices, protective coatings and jewelry aesthetics.

Due to excellent electrical, thermal and mechanical properties, the semiconductor industry is poised to benefit from UNCD films. Specifically, in an era where a wide variety of computing applications are demanding a doubling of digital storage capacity every 1.5 years. Social media, video and photograph storage, memory sticks, storage centers, and data analytics are putting pressure on chip manufacturers to increase memory density.

Demand fuels innovation, and the shift from 2D to 3D NAND storage is a clear example. The transition to 3D NAND is to increase the number of bits stored in a given area achieved by increasing the number of oxide-nitride (ONON) layers from 96 and beyond. However, when scaling 3D NAND from 96 layers to 128 and higher seems to be the breaking point where changes in materials and fabrication processes will be necessary to maintain yield and performance at an acceptable level. The high aspect ratio (HAR) of these devices poses a challenge for achieving uniform etch from top to bottom of the ONON stack with a suitable hard mask (HM) that is able to withstand an aggressive plasma etch chemistry. If the HM degrades during the etching process, loss of the pattern or loss of a vertical profile will cause device yield issues.

Typically, HM used in 3D NAND production consists of thick amorphous carbon films (~2 μm) that can withstand the plasma etching process. Despite numerous advantages, amorphous carbon films are susceptible to etching when exposed to the reactive plasma for the length of time required to process 3D NAND structure.

Accordingly, there is an ongoing need in the art for improved hard masks and methods of forming hard masks.

SUMMARY

One or more embodiments of the disclosure are directed to methods of forming a hard mask. The methods comprise exposing a substrate to a deposition gas comprising a dopant gas or precursor, a carbon gas and argon at a temperature less than or equal to 550 C. A plasma is ignited from the deposition gas to form an ultrananocrystalline diamond film having an average roughness less than 10 nm and a modulus greater than or equal to 250 GPa.

Additional embodiments of the disclosure are directed to methods comprising forming a hard mask on a substrate comprising: exposing the substrate to a deposition gas and igniting a pulsed microwave plasma form the deposition gas. The deposition gas comprises a dopant gas comprising one or more of a, nitrogen dopant, boron dopant species, a sulfur dopant species or a phosphorous dopant species, a carbon gas comprising one or more of methane or carbon dioxide in $H_2$, and in the range of 10% to 90% argon. The substrate is maintained at a temperature less than or equal to 550° C. The pulsed microwave plasma is ignited to form an ultrananocrystalline diamond film having an average roughness less than 10 nm and a modulus greater than or equal to 250 GPa. The pulsed microwave plasma has a 50% duty cycle. The hard mask is patterned to form a patterned hard mask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the disclosure are directed to boron doped ultrananocrystalline diamond (BDUNCD) films grown using a plasma process at relatively low temperatures. One or more embodiments of the disclosure are directed to boron doped ultrananocrystalline diamond (BDUNCD) films grown using Microwave Plasma Chemical Vapor Deposition (MPCVD) at temperatures less than 550° C. Some embodiments advantageously provide films with lower thickness than for conventional hard masks.

Figure 1:
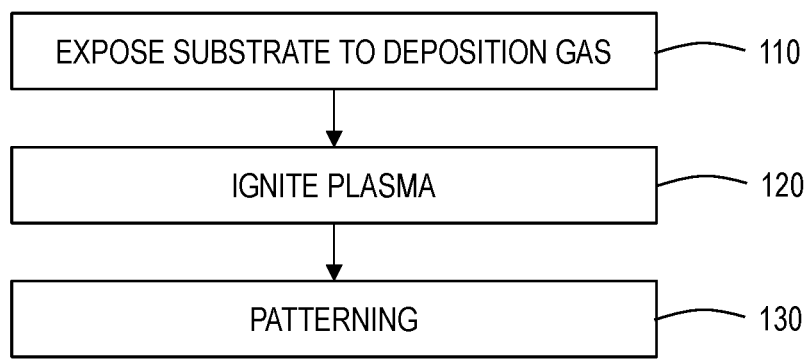
FIG. 1 is a flowchart of a method according to one or more embodiment of the disclosure.
Figure 2:
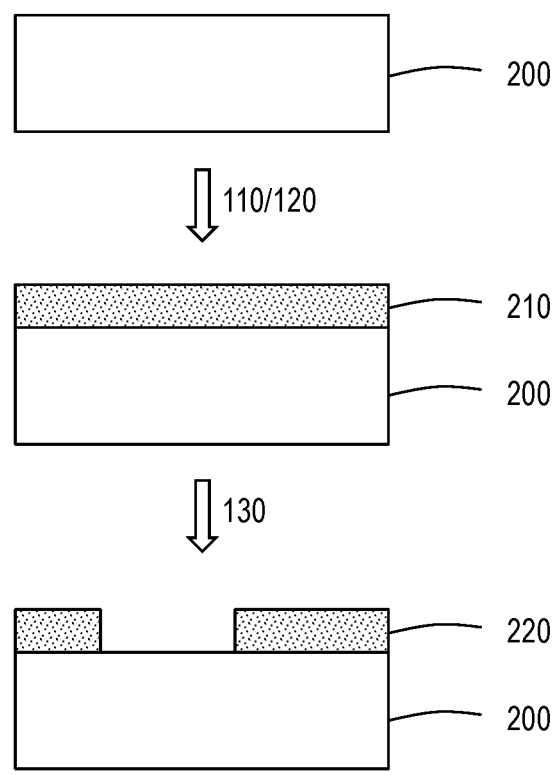
FIG. 2 is a schematic representation of a substrate during formation of a patterned hard mask according to one or more embodiment of the disclosure.

Referring to FIGS. 1 and 2, one or more embodiments of the disclosure are directed to methods 100 of forming a hard mask 210 or patterned hard mask 220. The method 100 of some embodiments, at process 110, comprises exposing a substrate 200 to a deposition gas or a precursor (solid (e.g. Alkylborane compounds) or liquid (e.g. Borazine)). The deposition gas comprises a dopant gas or precursor, a carbon gas and argon. In some embodiments, the dopant gas, the carbon gas and argon are mixed in the process chamber.

As used in this manner, a dopant gas refers to a gaseous species that can form a dopant within the film. Dopant gases include dopant precursors and species from solid, liquid or gaseous sources. The dopant gas of some embodiments comprises one or more of a nitrogen dopant, boron dopant species, a sulfur dopant species, or a phosphorous dopant species. In some embodiments, the dopant gas comprises or consists essentially of a boron dopant species. As used in this manner, the term "consists essentially of" means that the dopant species of the deposition gas are greater than or equal to 95%, 98%, 99% or 99.5% of the stated species on a molar basis.

In some embodiments, the dopant gas comprises or consists essentially of diborane ($B_2H_6$). In some embodiments, the dopant gas comprises in the range of 5% to 20% diborane in $H_2$. In some embodiments, the dopant gas comprises 15% diborane in $H_2$. In some embodiments, the dopant gas comprises or consists essentially of a sulfur dopant species. In some embodiments, the dopant gas comprises or consists essentially of a phosphorous dopant species.

The carbon gas component of the deposition gas can be any suitable carbon compounds that are compatible with the deposition process. In some embodiments, the carbon gas comprises or consists essentially of one or more of methane or carbon dioxide, in $H_2$. In some embodiments, the carbon compounds of the deposition gas comprise a mixture of $CH_4$ and $CO_2$ in $H_2$.

The amount of argon in the deposition gas can be adjusted. In some embodiments, the deposition gas has in the range of 10% to 90% argon, on a molar basis. In some embodiments, the deposition gas comprises greater than or equal to 50%, 60%, 70% or 80% argon, on a molar basis.

During exposure to the deposition gas, the substrate is maintained at a temperature less than or equal to 550 C. In some embodiments, the substrate is maintained at a temperature greater than or equal to −50 C and less than or equal to 550 C. In some embodiments, the substrate is maintained at a minimum temperature greater than or equal to −50 C and a maximum temperature less than or equal to 550 C, 500 C, 450 C, 400 C or 350 C.

At process 120, the deposition gas is exposed to conditions to ignite a plasma and form an ultrananocrystalline diamond film 210. In some embodiments, the plasma is a microwave plasma. In some embodiments, the microwave plasma is a pulsed plasma having a duty cycle in the range of 5% to 90%, or in the range of 15% to 85%, or in the range of 25% to 75%, or 50%. The microwave plasma of some embodiments has a power in the range of 1 kW to 12 kW, or in the range of 2 kW to 11 kW, or in the range of 3 kW to 10 kW. The chamber pressure during the plasma exposure of some embodiments is in the range of 0.05 Torr to 10 Torr, or in the range of 0.1 Torr to 5 Torr, or in the range of 0.2 Torr to 2 Torr. The spacing between the substrate and the microwave plasma source can affect the film roughness. In some embodiments, the microwave plasma source is spaced a distance from the substrate in the range of 2 cm to 12 cm, or in the range of 3 cm to 11 cm, or in the range of 4 cm to 10 cm, or in the range of 5 cm to 8 cm, or in the range of 6 cm to 7 cm.

In some embodiments, the average roughness of the ultrananocrystalline diamond film is reduced relative to a film formed without the plasma process. The ultrananocrystalline diamond film 210 of some embodiments has an average roughness, measured by atomic force microscopy (AFM), less than or equal to 10 nm. In some embodiments, the ultrananocrystalline diamond film 210 has an average roughness in the range of 1 nm to 9 nm, or in the range of 2 nm to 8 nm, or in the range of 3 nm to 7 nm.

The ultrananocrystalline diamond film 210 of some embodiments has a modulus greater than or equal to 250 GPa. In some embodiments, the ultrananocrystalline diamond film 210 has a modulus greater than or equal to 300 GPa, 350 GPa. In some embodiments, the ultrananocrystalline diamond film 210 has a modulus up to 400 GPa. In some embodiments, the ultrananocrystalline diamond film 210 has a modulus in the range of 250 GPa to 400 GPa, or in the range of 300 GPa to 350 GPa.

In some embodiments, the ultrananocrystalline diamond film 210 is a hard mask. The hard mask of some embodiments has a thickness in the range of 300 nm to 500 nm. Some embodiments of the disclosure are directed to methods 100 for forming a hard mask 220 on a substrate. Accordingly, some embodiments of the method 100 include a patterning process 130 where a pattern is etched into the hard mask to form a patterned hard mask 220. Patterning the hard mask can be performed by any suitable process known to the skilled artisan. For example, in some embodiments, the hard mask is patterned using one or more of lithography, metallization and/or etching.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a patterned hard mask, the method comprising:

exposing a semiconductor wafer to a deposition gas comprising a boron dopant gas comprising 5% to 20% diborane in $H_2$ on a molar basis, a carbon gas comprising one or more of methane or carbon dioxide in $H_2$ and 50% to 90% argon on a molar basis at a temperature less than or equal to 550° C.;

igniting a pulsed microwave plasma from the deposition gas to form a boron doped ultrananocrystalline diamond film having an average roughness less in a range of from 0.1 nm to 5 nm and a modulus in a range of from 250 to 400 GPa; wherein there is a gas pressure during forming the boron doped ultrananocrystalline diamond film in a range of 0.2 Torr to 2 Torr and a plasma power in a range of from 3 kW to 10 KW; and patterning the hard mask to form the patterned hard mask.

2. The method of claim 1, wherein the dopant gas further comprises one or more of a nitrogen dopant, a sulfur dopant species and a phosphorous dopant species.

3. The method of claim 1, wherein the deposition gas comprises greater than or equal to 60% argon.

4. The method of claim 1, wherein the pulsed microwave plasma is pulsed at a duty cycle in a range of 25% to 75%.

5. The method of claim 4, wherein the pulsed microwave plasma is pulsed at a 50% duty cycle.

6. The method of claim 5, wherein the film has a modulus greater than 350 GPa.

7. The method of claim 6, wherein the boron doped ultrananocrystalline diamond has a thickness in the range of 300 nm to 500 nm.

8. The method of claim 7, wherein the patterned hard mask is patterned by etching and subsequently withstands a reactive plasma etching during formation of a 3D NAND device.

9. The method of claim 1, wherein the temperature is less than or equal to 500° C.

10. The method of claim 1, wherein a microwave plasma source used to generate the pulsed microwave plasma is spaced at a distance from the semiconductor wafer in a range of from 5 cm to 8 cm.

11. A method of forming a patterned hard mask comprising:

forming a hard mask on a semiconductor wafer comprising:

exposing the semiconductor wafer to a deposition gas comprising a boron dopant gas comprising 5% to 20% diborane in $H_2$ on a molar basis a carbon gas comprising methane and carbon dioxide in $H_2$, and in the range of 10% to 90% argon on a molar basis at a temperature less than or equal to 550° C., and igniting a pulsed microwave plasma from the deposition gas to form a boron doped ultrananocrystalline diamond film having an average roughness in a range of from 0.1 nm to 5 nm and a modulus greater than or equal to 400 GPa, the pulsed microwave plasma having a 50% duty cycle; wherein there is a gas pressure during forming the boron doped ultrananocrystalline diamond film in a range of 0.2 Torr to 2 Torr and a plasma power in a range of from 3 kW to 10 kW; and patterning the hard mask to form a patterned hard mask on the semiconductor wafer.

12. The method of claim 11, wherein the deposition gas comprises greater than or equal to 50% argon.

13. The method of claim 12, wherein patterning the hard mask comprises etching the hard mask.

14. The method of claim 13, wherein the temperature is less than 500° C.

15. The method of claim 13, wherein the film comprises a hard mask with a thickness in the range of 300 nm to 500 nm.

16. The method of claim 15, wherein the patterned hard mask is patterned by etching and subsequently withstands a reactive plasma etching during formation of a 3D NAND device.

17. The method of claim 11, wherein a microwave plasma source used to generate the pulsed microwave plasma is spaced at a distance from the semiconductor wafer in a range of from 5 cm to 8 cm.

* * * * *